United States Patent [19]
Horie

[11] 4,051,506
[45] Sept. 27, 1977

[54] COMPLEMENTARY SEMICONDUCTOR DEVICE

[75] Inventor: Noboru Horie, Kodaira, Japan

[73] Assignee: Hitachi, Ltd., Japan

[21] Appl. No.: 689,819

[22] Filed: May 25, 1976

[30] Foreign Application Priority Data

May 28, 1975 Japan .............................. 50-62862

[51] Int. Cl.² ............... H01L 29/06; H01L 27/12; H01L 29/34; H01L 27/02
[52] U.S. Cl. .................................. 357/55; 357/44; 357/34; 357/49; 357/54
[58] Field of Search ............ 357/49, 44, 34, 54, 357/55

[56] References Cited
U.S. PATENT DOCUMENTS

| | | | |
|---|---|---|---|
| 3,893,155 | 7/1975 | Ogiue | 357/49 |
| 3,956,033 | 5/1976 | Roberson | 357/49 |

Primary Examiner—Edward J. Wojciechowicz
Attorney, Agent, or Firm—Craig & Antonelli

[57] ABSTRACT

A semiconductor device comprising at least a pair of NPN and PNP transistors is improved. This semiconductor device is characterized in that at least one pair of vertical transistors are formed in a semiconductor layer of the second conductivity type formed on a semiconductor substrate of the first conductivity type, the semiconductor layer of the second conductivity type serving as both the collector of one of the transistors and the base of the other and that the transistors are electrically insulated from each other by organic insulator formed on the inorganic insulating film on the semiconductor substrate. Thus, a semiconductor device can be obtained in which PNP transistors having good characteristics such as current amplification factor $h_{FE}$ and gain-bandwidth product $f_T$ are incorporated in an integrated circuit consisting mainly of NPN transistors.

11 Claims, 6 Drawing Figures

COMPLEMENTARY SEMICONDUCTOR DEVICE

FIELD OF THE INVENTION

This invention relates to a semiconductor device and more particularly to a complementary semiconductor integrated circuit (IC) comprising at least a pair of NPN and PNP transistors.

DESCRIPTION OF THE PRIOR ART

Figure 1:
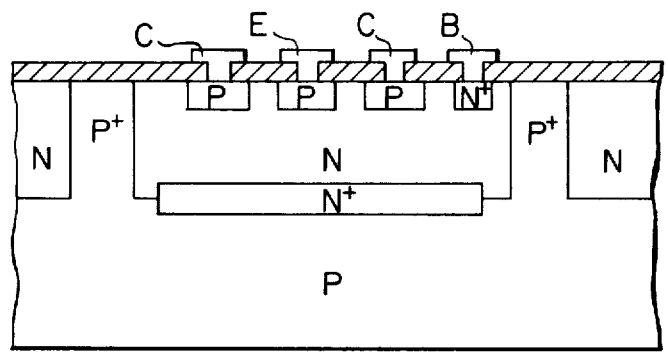
FIGS. 1 and 2 show in cross section a PNP transistor contained in the conventional IC's.

The PNP transistors which have so far been incorporated in an IC consisting mainly of NPN transistors are of lateral type except the substrate-collector type PNP transistor in which the substrate itself is employed as a collector and which is limited in application, and such lateral type PNP transistors can be formed without any special process being added. The lateral type PNP transistor has a structure in cross section as shown in FIG. 1, in which its base, collector and emitter are indicated respectively by B, C and E. In this structure, the base width is determined by the spread of the diffused base region in the lateral direction and therefore is difficult to control in the process of production. For this reason, in the design of the pattern allowance for this should be made. As shown in FIG. 1, since a p-type impurity diffuses laterally as well as vertically and since the p-type layers as an emitter and a collector are formed simultaneously with the formation of the base of the NPN transistor through diffusion, then the concentration of the impurity thereof cannot be determined discretely. And this results in the degradations of such characteristics as current amplification factor $h_{FE}$, gain-bandwidth product $f_T$, maximum current density $I_{c\ max}/l_E$ ($l_E$: length of emitter periphery) etc., leaving a difficulty in the design of circuits.

Figure 2:
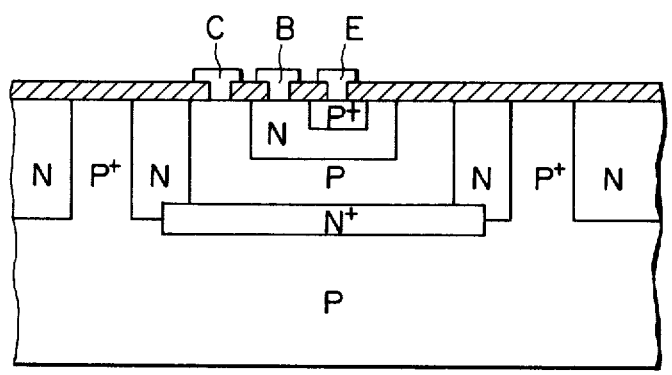

In order to eliminate these drawbacks and to fabricate PNP transistors having improved characteristics in an integrated configuration, a vertical PNP transistor is formed by using the triple-diffusion process, as shown in FIG. 2. This vertical PNP transistor indeed has a merit of improved $h_{FE}$ and $f_T$, but it also has drawbacks; the breakdown voltage is low, the collector series resistance $r_{sc}$ is large and the dimensions must be very precisely determined in the process of fabrication.

SUMMARY OF THE INVENTION

The object of this invention is to provide a semiconductor device in which PNP transistors having excellent characteristics, e.g. $h_{FE}$, $f_T$ and breakdown voltage, are incorporated in an IC consisting mainly of NPN transistors.

This invention is characterized in that at least one pair of vertical transistors are formed in a semiconductor layer of the second conductivity type formed on a semiconductor substrate of the first conductivity type, the semiconductor layer of the second conductivity type serving as both the collector of one of the transistors and the base of the other and that the transistors are electrically insulated from each other by an organic insulator formed on the inorganic insulating film on the semiconductor substrate.

DESCRIPTION OF THE PREFERRED EMBODIMENTS

Figure 3:
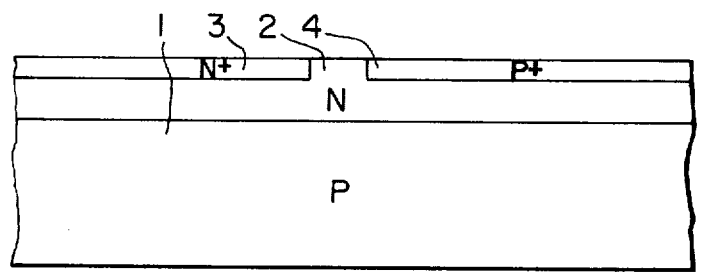
FIGS. 3 to 6 show in cross section the various phases of a semiconductor IC according to this invention, in the steps of manufacturing process.
Figure 4:
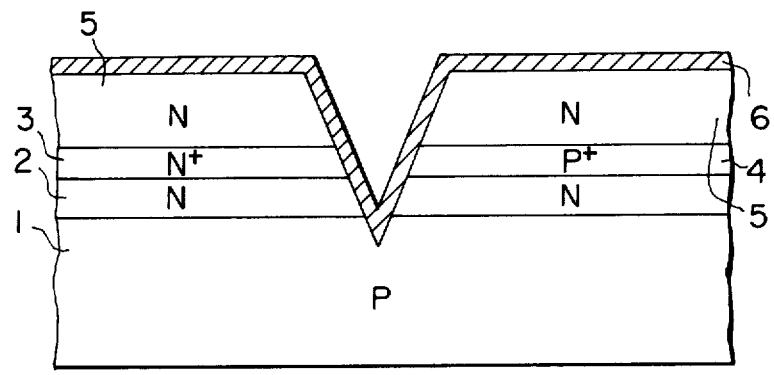
Figure 5:
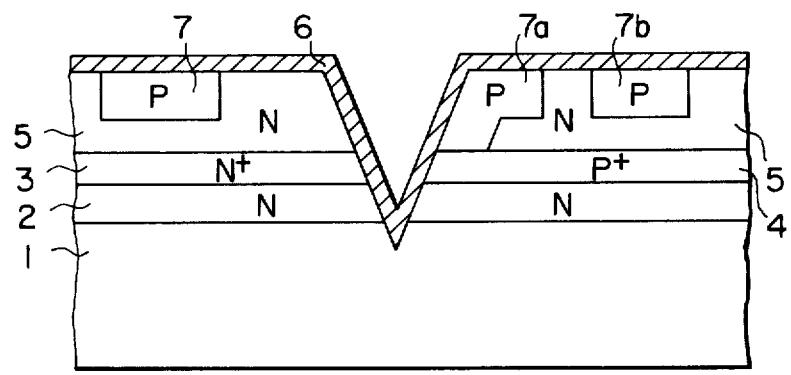
Figure 6:
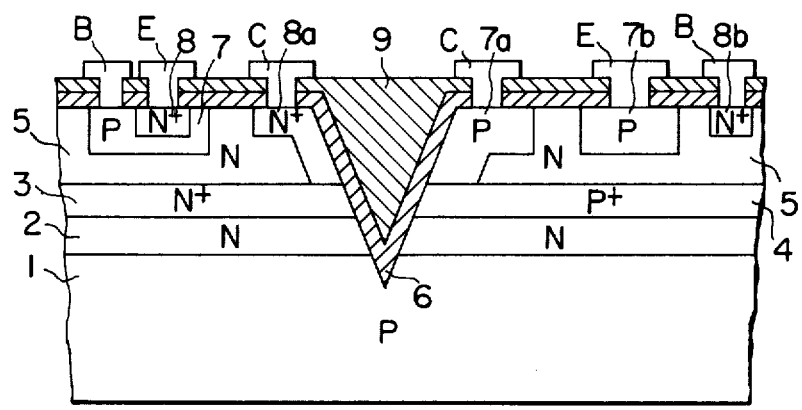

FIG. 6 shows in cross section an IC as an embodiment of this invention. The IC having such a structure as shown is fabricated as follows. First, an N-type epitaxial layer 2 is formed on a p-type silicon (Si) substrate 1, as shown in FIG. 3 for the purpose of floating the junction between the substrate and a collector region of a PNP transistor. An N+ embedded layer 3 and a P+ embedded layer 4 are separately formed in the N epitaxial layer 2 through diffusion using a mask with the view of reducing $r_{sc}$. An N epitaxial layer 5 is formed on the N epitaxial layer 2 including the embedded layers 3 and 4, as shown in FIG. 4. By using anisotropic etching solution (alkali etching solution such as KOH) which etches away the silicon substrate in the plane (100) faster than in the plane (111), that part of the silicon substrate which serves as an isolating region is etched away. The anisotropic etching is continued until a V-shaped groove is cut in the isolation region and reaches the silicon substrate. A film 6 of $SiO_2$ is formed on the surface of the N epitaxial layer 5 including the region and p-type layers 7, 7a and 7b are formed, as shown in FIG. 5, through selective diffusion using the $SiO_2$ film 6 as a mask.

As shown in FIG. 6, N+ layers 8, 8a and 8b are formed through selective diffusion using a mask and an organic insulating film 9 of a resin such as a thermoplastic polymer resin, a thermosetting polymer resin, etc. is formed on the $SiO_2$ film 6 to fill the V-shaped groove and to make a plane surface. The dielectric films 6 and 9 are perforated at predetermined locations so as to contact electrodes to predetermined layers. Thus, electrodes B, C and E and internal electric wiring are completed by the vacuum evaporation of Al and through photoetching techniques.

This invention has the following features:

1. The PNP transistor operates as a vertical type transistor due to the presence of the P+ embedded layer 4 structure and therefore its characteristics are more excellent than those of a conventional lateral type PNP transistor.

2. Since the PNP transistor and the NPN transistors are fabricated by using the same techniques, the process for fabricating the resultant IC can be facilitated. In the conventional structure such as shown in FIGS. 1 and 2, since the out-diffusion of the N+ embedded layer into the epitaxial N layer occurs during the diffusion of the isolation P+ layer into the epitaxial N layer which is generally executed for several hours or for more than ten hours as the case may be, the thickness of the epitaxial N layer must be determined by sufficiently considering the out-diffusion. On the other hand, in this invention, the diffusion of the isolation layer is not required so that the out-diffusion of embedded layers 3 and 4 is extremely small. Thus, the N epitaxial layer 5 can be rendered as thin as possible.

3. The semiconductor device is of the dielectric-insulated type and similar in structure to the V-ATE (Vertical Anisotropic), the VIP (V-Groove-Isolation filled Polysilicon), the EVG (Epitaxial V-Groove) or the Polyplanar configuration which employ the separation or isolation method using anisotropic etching, so that the isolation is excellent and that the area occupied by each element can be made small to increase the density of integration.

4. Since the base of the PNP transistor is the N epitaxial layer 5, it has a lower impurity concentration than the P+ embedded layer 4 serving as a collector so that the depletion region can expand to occupy almost all the base region. Consequently, the breakdown voltage is between an emitter and collector with the base being opened, $BV_{CEO}$ high and the collector resistance $r_{sc}$ is small.

5. The width of the base of the PNP transistor can be easily controlled since it is of vertical structure and the number of surface recombination centers in the base region can be reduced so that both $h_{FE}$ and $f_T$ are large and noise and leakage current are small.

6. Since the V-shaped groove in the isolation region is filled with organic insulating material such as resin to form a flat surface, the work is much simpler in comparison with the conventional method in which the groove is filled with polycrystalline silicon and excessive polycrystalline silicon is polished away to make a flat surface of the wafer. Consequently, the faults in wiring with an Al thin film can be eliminated so that a high reliability is assured.

Namely, this invention provides a semiconductor device in which PNP transistors having a high reliability, a high performance, large $h_{FE}$ and $f_T$, and a high breakdown voltage and having little noise and leakage current and no fault in Al wiring are incorporated in the IC consisting mainly of NPN transistors.

This invention is not limited to the above embodiment but can be applied to various production procedures (for example, the case where the P layers serving as the collector and emitter of the PNP transistor are formed in a step other than that of forming the P layer serving as the base of the NPN transistor so as to increase the impurity concentration and therefore to improve the characteristics) and device structures.

I claim:

1. A complementary semiconductor device comprising
   a. a p-type Si substrate;
   b. a first N-type epitaxial layer formed through epitaxial growth on said P-type Si substrate;
   c. N+ and P+ embedded layers formed in said first N-type epitaxial layer through diffusion using a mask;
   d. a second N-type epitaxial layer formed on said first N-type epitaxial layer including both said embedded layers;
   e. a V-shaped groove dividing into two parts said first epitaxial layer, said second epitaxial layer and separating said N+ and P+ embedded layers from each other;
   f. a SiO$_2$ film formed on the surface of said second N-type epitaxial layer including said V-shaped groove;
   g. a first, second and third P-type regions formed in said second N-type epitaxial layer by using said SiO$_2$ film as a diffusion mask, with their surfaces exposed, said first P-type region being formed in the left side part of said second epitaxial region divided by said V-shaped groove, said second and third P-type regions being formed in the right side part of said second epitaxial region and said second P-type region being in contact with the side surface of said V-shaped groove and said P+ embedded layer;
   h. a first N+ region formed in said first P-type region with its surface exposed, a second N+ region formed in the left side part of said second epitaxial layer with its surface exposed and in contact with the side surface of said V-shaped groove and said N+ embedded layer, and a third N+ region formed in the right side part of said second epitaxial layer with the surface exposed;
   i. an organic insulating material filling said V-shaped groove with said SiO$_2$ film disposed underneath, the surface of said organic insulating material being flat; and
   j. a first base electrode attached to said first P-type region, a first emitter electrode attached to said first N+ region, a first collector electrode attached to said second N+ region, a second collector electrode attached to said second P-type region, a second emitter electrode attached to said third P-type region and a second base electrode attached to said third N+ regions.

2. In a complementary semiconductor device comprising
   a. a semiconductor substrate having a first conductivity type and two main surfaces;
   b. a first semiconductor layer having a second conductivity type, opposite said first conductivity type, formed in one of said main surfaces of said substrate;
   c. at least a pair of first and second transistors, said first semiconductor layer serving as both the collector region of one of said transistors and the base region of the other;
   d. a V-shape region for electrically isolating said transistors from each other;
   e. organic insulating material filling said V-shaped region with an inorganic insulating film disposed underneath;
   f. a second semiconductor layer having said second conductivity type, formed between said first semiconductor layer and said surface of said semiconductor substrate; and
   g. embedded layers having high impurity concentrations and having said first and second conductivity types, embedded in said second semiconductor layer, the improvement wherein said first transistor is a vertical type transistor and said second transistor serves as another vertical type transistor due to the existence of said embedded layer having second conductivity type.

3. The improvement as claimed in claim 2, wherein said first semiconductor layer is formed through epitaxial growth.

4. The improvement as claimed in claim 2, wherein said second semiconductor layer is formed through epitaxial growth.

5. The improvement as claimed in claim 2, wherein said V-shaped groove reaches said semiconductor substrate.

6. The improvement as claimed in claim 2, wherein said semiconductor substrate is P-type silicon.

7. The improvement as claimed in claim 2, wherein said inorganic insulating film is of SiO$_2$ while said organic insulating material is resin.

8. A complementary semiconductor device having a vertical NPN bipolar transistor and a vertical PNP bipolar transistor formed in the same semiconductor body while being isolated from each other, comprising:
a semiconductor body having a first surface in which there is formed a groove extending from said first surface down to semiconductor material of a first conductivity type so as to separate a portion of said semiconductor body into first and second parts isolated from each other by said groove, said first part of said body including a first semiconductor region of a second conductivity type, opposite said first conductivity type, extending from said first surface and forming a first PN junction with said semiconductor material, said first semiconductor region constituting the collector region of one of said transistors, a second semiconductor region of said first conductivity type, disposed in a surface portion of said first semiconductor region, and constituting the base region of said one transistor, and a third semiconductor region of said second conductivity type, disposed in a surface portion of said second semiconductor region and constituting the emitter region of said one transistor, and said second part of said body including a fourth semiconductor region of said second conductivity type extending from said first surface to a prescribed depth into said semiconductor body, and constituting the base region of the other of said transistors, a fifth semiconductor region of said first conductivity type contacting and disposed beneath said fourth semiconductor region and constituting the collector region of said other transistor, a sixth semiconductor region of said first conductivity type disposed in a surface portion of said fifth semiconductor region and constituting the emitter of said other transistor, and a seventh semiconductor region of said second conductivity type disposed between and adjoining said semiconductor material and said fifth semiconductor region, and respective electrodes in ohmic electrical connection with said first, second, third, fourth, fifth and sixth semiconductor regions.

9. A complementary semiconductor device according to claim 8, wherein said first conductivity type is P-type conductivity and said second conductivity type is N-type conductivity.

10. A complementary semiconductor device according to claim 8, wherein said groove is filled with plural layers of inorganic insulating material and organic insulating material disposed thereon.

11. A complementary semiconductor device according to claim 8, wherein the impurity concentration of said fifth semiconductor region exceeds the impurity concentration of said fourth semiconductor region.

* * * * *